United States Patent
Brewer et al.

(10) Patent No.: US 9,845,235 B2
(45) Date of Patent: Dec. 19, 2017

(54) REFRACTORY SEED METAL FOR ELECTROPLATED MEMS STRUCTURES

(71) Applicant: General Electric Company, Schenectady, NY (US)

(72) Inventors: Joleyn Eileen Brewer, Clifton Park, NY (US); Christopher Fred Keimel, Schenectady, NY (US); Marco Francesco Aimi, Niskayuna, NY (US); Andrew Minnick, Saratoga Springs, NY (US); Renner Stephen Ruffalo, Menands, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 14/844,132

(22) Filed: Sep. 3, 2015

(65) Prior Publication Data

US 2017/0066645 A1    Mar. 9, 2017

(51) Int. Cl.
*B81B 3/00* (2006.01)
*H01L 29/84* (2006.01)
(Continued)

(52) U.S. Cl.
CPC .......... *B81B 3/0027* (2013.01); *B81B 3/0075* (2013.01); *B81B 7/0003* (2013.01); *B81B 7/008* (2013.01); *B81C 1/0015* (2013.01); *B81C 1/00134* (2013.01); *B81C 1/00158* (2013.01); *B81C 1/00182* (2013.01); *B81C 1/00373* (2013.01); *G01L 9/0042* (2013.01);
(Continued)

(58) Field of Classification Search
None
See application file for complete search history.

(56) References Cited

U.S. PATENT DOCUMENTS

| 6,136,707 A | 10/2000 | Cohen |
| 6,489,235 B2 | 12/2002 | Gilton et al. |

(Continued)

OTHER PUBLICATIONS

Thomas et al., "The Potential of Using Refractory Metals and Barrier Layers to Generate High Temperature Interconnects," V-MIC Conf., IEEE, Jun. 13-14, 1988, Santa Clara, CA, USA, pp. 183-190.

(Continued)

*Primary Examiner* — Minh-Loan Tran
(74) *Attorney, Agent, or Firm* — Ziolkowski Patent Solutions Group, SC; Jean K. Testa

(57) ABSTRACT

A system and method for a micro-electrical-mechanical system (MEMS) device including a substrate and a free-standing and suspended electroplated metal MEMS structure formed on the substrate. The free-standing and suspended electroplated metal MEMS structure includes a metal mechanical element mechanically coupled to the substrate and a seed layer mechanically coupled to and in electrical communication with the mechanical element, the seed layer comprising at least one of a refractory metal and a refractory metal alloy, wherein a thickness of the mechanical element is substantially greater than a thickness of the seed layer such that the mechanical and electrical properties of the free-standing and suspended electroplated metal MEMS structure are defined by the material properties of the mechanical element.

21 Claims, 5 Drawing Sheets

(51) Int. Cl.
*B81C 1/00* (2006.01)
*G01L 9/00* (2006.01)
*B81B 7/00* (2006.01)

(52) U.S. Cl.
CPC ........ *G01L 9/0044* (2013.01); *B81B 2201/01* (2013.01); *B81B 2201/014* (2013.01); *B81B 2201/0228* (2013.01); *B81B 2203/0118* (2013.01); *B81B 2203/0127* (2013.01); *B81B 2203/0315* (2013.01); *B81B 2203/053* (2013.01); *B81B 2207/015* (2013.01); *B81B 2207/115* (2013.01); *B81C 2201/0107* (2013.01)

(56) References Cited

U.S. PATENT DOCUMENTS

| | | |
|---|---|---|
| 7,176,047 B2 | 2/2007 | Chang et al. |
| 7,202,764 B2 | 4/2007 | Deligianni et al. |
| 7,956,429 B1 * | 6/2011 | Kim ............... H01L 27/101 257/414 |
| 8,159,056 B1 * | 4/2012 | Kim ............... B81C 1/00333 216/2 |
| 8,445,306 B2 | 5/2013 | Lindgren et al. |
| 8,570,638 B2 | 10/2013 | Lu et al. |
| 8,691,607 B2 | 4/2014 | Ararao |
| 8,957,485 B2 * | 2/2015 | Lacey ............... B81B 3/007 257/415 |
| 2005/0277281 A1 | 12/2005 | Dubin et al. |
| 2010/0181631 A1 | 7/2010 | Lacey |
| 2010/0291410 A1 | 11/2010 | Novotny et al. |
| 2011/0014400 A1 | 1/2011 | Huang et al. |
| 2011/0163397 A1 | 7/2011 | Detor et al. |
| 2014/0008812 A1 | 1/2014 | Emesh |

OTHER PUBLICATIONS

Rossnagel et al., "Thin, high atomic weight refractory film deposition for diffusion barrier, adhesion layer, and seed layer applications," Journal of Vacuum Science & Technology B: Microelectronics and Nanometer Structures, IEEE, May/Jun. 1996, vol. 14, No. 3, pp. 1819-1827.

Zangari, "Microelectromechanical Systems," Modern Electroplating, Fifth Edition, 2010, pp.

International Search Report and Written Opinion issued in connection with corresponding PCT Application No. PCT/US2016/041954 dated Mar. 6, 2017.

* cited by examiner

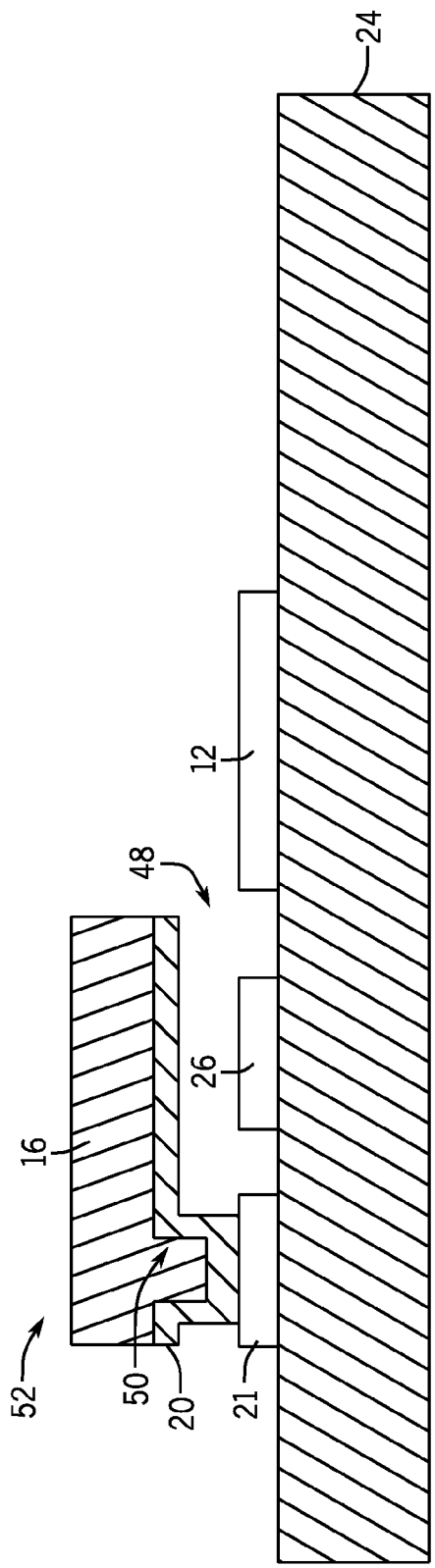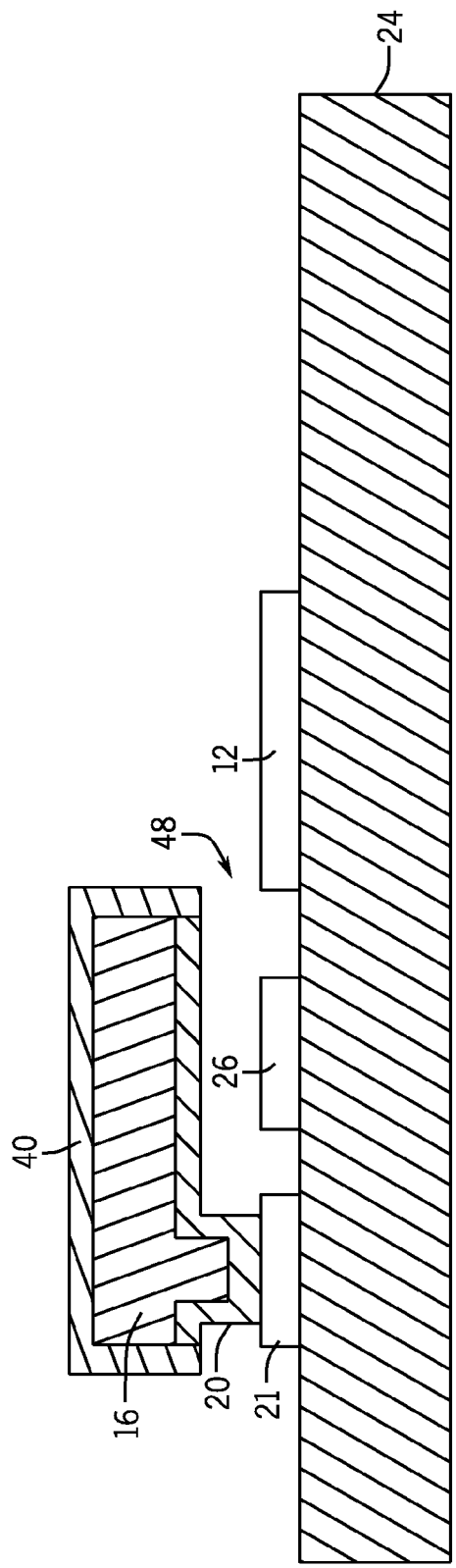

REFRACTORY SEED METAL FOR ELECTROPLATED MEMS STRUCTURES

BACKGROUND OF THE INVENTION

Embodiments of the invention relate generally to a Micro-Electro-Mechanical Systems (MEMS) device and, more particularly, to a metal MEMS device where the mechanical element is comprised of an electroplated metal that is deposited onto an seed layer consisting of a refractory metal. In one embodiment, the seed layer is left intact on a bottom surface of the mechanical element to act as an electrical contact for the mechanical element in an embodiment where the MEMS device is constructed as a MEMS switch.

MEMS is a technology that in its most general form can be defined as miniaturized mechanical and electro-mechanical elements (i.e., devices and structures) that are made using the techniques of microfabrication. The critical physical dimensions of MEMS devices can vary from well below one micron on the lower end of the dimensional spectrum, all the way to several millimeters. Likewise, the types of MEMS devices can vary from relatively simple structures having no moving elements, to extremely complex electro-mechanical systems with multiple moving elements under the control of integrated microelectronics, with free-standing MEMS structures or "beams" often acting as relays, for example.

With respect to MEMS devices having moving elements, such a moving element may be in the form of a free-standing and suspended. MEMS structure that is configured as a cantilever with a first end anchored to a substrate (e.g., fused silica, glass, silicon substrates) and a second free end having a contact. When the MEMS device is activated, the free-standing MEMS structure moves its contact against a substrate contact on the device substrate and under the MEMS structure contact.

In fabricating/forming such a metal MEMS free-standing structure, an electroplating process is employed whereby a metallic material is electroplated onto an electrically conductive metal layer, i.e, a "seed layer," which is necessary to carry the current which facilitates the metal deposition at the wafer surface. Typically, this metal seed layer must be removed at the end of the fabrication process by one of several metal etching methodologies (i.e. wet chemical etching, reactive ion etching). Failure to fully remove this seed layer can result in device failures such as shorting between electrical elements, and it is recognized that the method for etching the seed must be designed such that it does not damage the MEMS structures present on the substrate.

With specific regard to MEMS switches, it is further recognized that—in operation—the contacting of the free-standing structure with the substrate contact can cause the free-standing structure (i.e., a contact of the free-standing structure) to experience mechanical wear due to repeated physical impact with the substrate contact, heating of the free-standing structure contact by joule heating, and electrical discharges between the free-standing structure contact and the substrate contact. This wearing of the free-standing structure contact can eventually lead to reliability issues in the MEMS switch.

Therefore, it is desirable to provide a free-standing MEMS structure that may be fabricated by electroplating the free-standing MEMS structure onto a seed layer, with the seed layer also acting as a contact material, thus eliminating the need to remove the seed metal at the end of the process. It is also desirable that this seed layer be tailored so that it acts as the contact layer while at the same time it does not contribute significantly to the mechanical and electrical properties of the beam/seed layer structure over a range of temperatures. For example, the stress in the films affects the planarity of the released MEMS structure, and so, must be controlled. It is still further desirable that the seed layer, in acting as an ohmic contact for the free-standing structure, be formed of a refractory metal or refractory metal alloy exhibiting properties such as melting temperature above 1850° C. and a melting voltage above 0.4 V, such that it exhibits increased resistance to mechanical wear and exhibits increased longevity when exposed to at high temperatures and electrical discharges.

BRIEF DESCRIPTION OF THE INVENTION

In accordance with one aspect of the invention, a micro-electrical-mechanical system (MEMS) device includes a substrate and a free-standing and suspended electroplated metal MEMS structure formed on the substrate. The free-standing and suspended electroplated metal MEMS structure includes a metal mechanical element mechanically coupled to the substrate and a seed layer mechanically coupled to and in electrical communication with the mechanical element, the seed layer comprising at least one of a refractory metal and a refractory metal alloy, wherein a thickness of the mechanical element is substantially greater than a thickness of the seed layer such that the mechanical and electrical properties of the free-standing and suspended electroplated metal MEMS structure are defined by the material properties of the mechanical element.

In accordance with another aspect of the invention, a method of creating a micro-electrical-mechanical system (MEMS) device includes providing a substrate and forming a free-standing MEMS structure on the substrate. Forming the free-standing MEMS structure includes applying a sacrificial release layer on a portion of the substrate, applying a layer of seed metal over the substrate and the sacrificial release layer, wherein the seed metal comprises at least one of a refractory metal and a refractory metal alloy, applying a photoresist layer on a portion of the layer of seed metal, electroplating a metallic material onto the layer of seed metal not covered by the photoresist layer to form a free-standing structure, and removing the photoresist layer, the sacrificial release layer, and a portion of the layer of seed metal not in contact with the free-standing structure, such that the free-standing structure is cantilevered over the substrate, wherein a portion of the layer of seed metal in contact with the free-standing structure remains on an underside of the free-standing structure subsequent to the removing of the photoresist layer, the sacrificial release layer, and the portion of the layer of seed metal not in contact with the free-standing structure.

In accordance with yet another aspect of the invention, a free-standing and suspended metal micro-electro-mechanical system (MEMS) structure of a MEMS device is fabricated by applying a sacrificial release layer on a portion of a substrate, applying a seed layer of refractory metal over the substrate and the sacrificial release layer, applying a photoresist layer on a portion of the seed layer, electroplating a metallic material onto the seed layer in an area not covered by the photoresist layer to form a free-standing structure, the free-standing structure being mechanically coupled to and electrically connected with the seed layer, and removing the photoresist layer, the sacrificial release layer, and a portion of the seed layer such that a layer of refractory metal remains on an underside of the free-standing structure to collectively form a free-standing and suspended metal MEMS structure on the substrate.

Various other features and advantages will be made apparent from the following detailed description and the drawings.

BRIEF DESCRIPTION OF THE DRAWINGS

The drawings illustrate embodiments presently contemplated for carrying out the invention.

In the drawings:

FIGS. 4-9 are side cross-sectional views showing steps of making a MEMS device, according to an embodiment of the invention.

DETAILED DESCRIPTION

Embodiments of the invention provide for a MEMS device having a free-standing and suspended metal MEMS structure that is formed on/adjacent a substrate by electroplating of a free-standing mechanical structure or element onto a refractory metal seed layer. The seed layer provides a conductive layer onto which the electroplated free-standing structure is formed. In this embodiment, the seed layer can also act as the electrical contact for the free-standing structure when the MEMS device is in the form of a MEMS switch. In addition, the seed layer—when combined with an accompanying protective layer formed on other surfaces of the free-standing structure—can protect the free-standing structure from etching or damage associated with cleaning and/or etching steps performed in the fabrication process.

Figure 1:
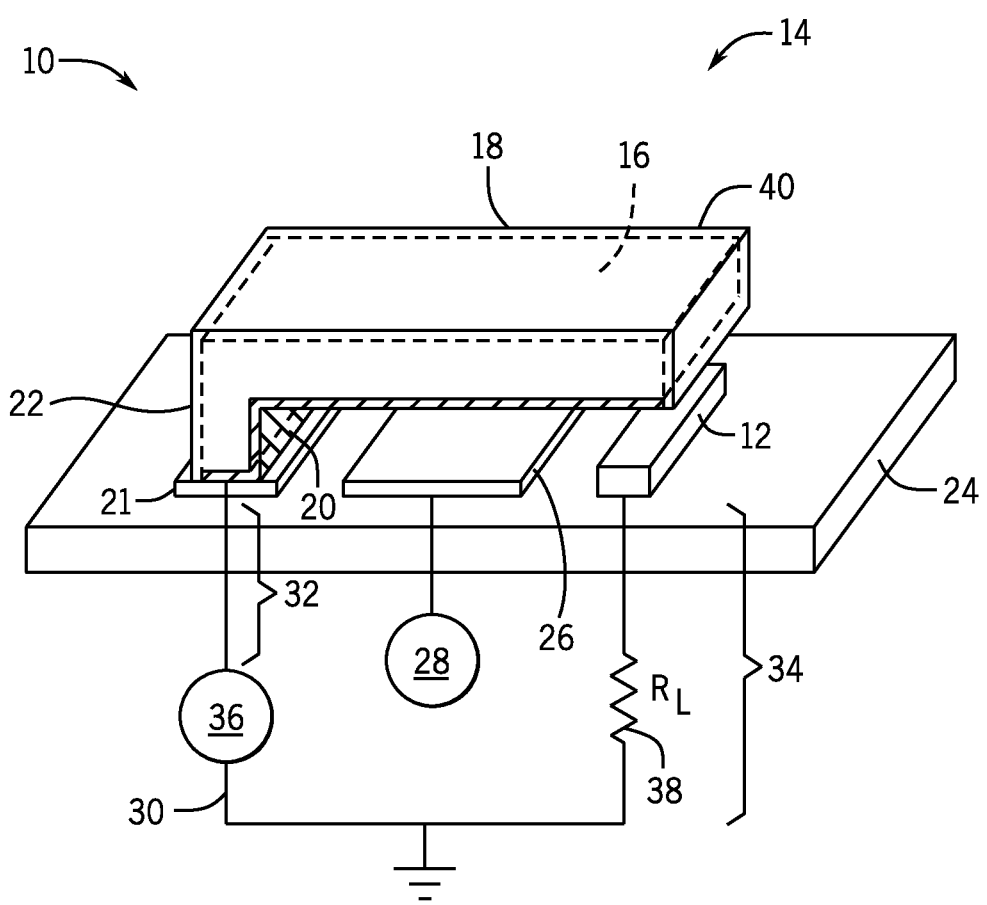
FIG. 1 is a schematic perspective view of a MEMS device, according to an embodiment of the invention.
Figure 2:
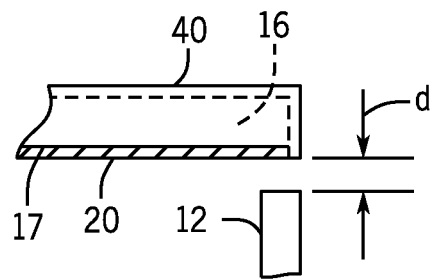
FIG. 2 is a schematic side view of the MEMS device of FIG. 1 in an open position.
Figure 3:
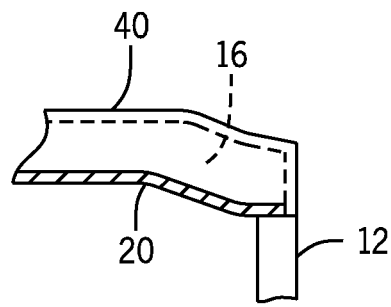
FIG. 3 is a schematic side view of the MEMS device of FIG. 1 in a closed position.

Referring to FIGS. 1-3, schematic perspective views of a micro-electro-mechanical system (MEMS) device 10 are shown in accordance with an embodiment of the invention. While MEMS device 10 is depicted in FIGS. 1-3 as a switch, it is contemplated that MEMS device 10 may be in the form of any of a number of different MEMS device, such as a resonator, an inertial sensor or a test probe, for example, according to other embodiments of the invention. According to the embodiment shown in FIGS. 1-3, the MEMS device 10 includes a substrate contact 12 (included when the MEMS device is a switch), which comprises a conductive material (e.g., metal). MEMS device 10 also includes a free-standing and suspended mechanical MEMS structure 14 that comprises a free-standing structure/mechanical element 16—such as a beam—with the free-standing structure 16 having a cantilevered portion 18 that extends over contact 12, and with an underside or bottom surface 17 of the free-standing structure 16 being covered by a seed layer 20 that is mechanically coupled to and electrically connected with the structure, as will be discussed in greater detail below. The free-standing structure 16 is supported by an anchor portion 22, from which the cantilevered portion 18 extends, and which may be integrated with the free-standing structure 16. The anchor portion 22 serves to connect the cantilevered portion 18 of the free-standing structure 16 to an underlying support structure, such as a conductive mount 21 formed on a substrate 24. The substrate 24 may be formed of any of a number of materials suitable for MEMS device fabrication, including silicon and silicon-based substrates (e.g., silicon carbide (SiC)), fused silica or glass, for example.

The free-standing MEMS structure 14 may constitute a portion of a microelectromechanical or nanoelectromechanical device or a MEMS device 10. For example, the contact 12 and free-standing structure 16 may have dimensions on the order of ones or tens of nanometers or micrometers. In one embodiment, the free-standing structure 16 may have a surface area-to-volume ratio that is greater than or equal to $10^8$ m$^{-1}$, while in another embodiment the ratio may be closer to $10^3$ m$^{-1}$.

As shown in FIGS. 2 and 3, the free-standing structure 16 can be configured to be selectively moveable between a first, non-contacting or "open" position, shown in FIG. 2, in which the free-standing structure 16 (and seed layer 20) is separated from the contact 12 by a separation distance d, and a second, contacting or "closed" position, shown in FIG. 3, in which the free-standing structure 16 (and seed layer 20) comes into electrical contact with the contact 12. As shown, seed layer 20 acts as the electrical contact for free-standing structure 16. As such, seed layer 20 electrically couples free-standing structure 16 and contact 12 when seed layer 20 comes into mechanical contact and electrical communication with electrical contact 12. Further, the free-standing structure 16 and seed layer 20 can be configured to undergo deformation when moving between the contacting and non-contacting positions, such that the free-standing structure 16 and seed layer 20 are naturally disposed (i.e., in the absence of externally applied forces) in the non-contacting position and may be deformed so as to occupy the contacting position while storing mechanical energy therein. In other embodiments, the undeformed configuration of the free-standing structure 16 and seed layer 20 may be the contacting position.

The MEMS device 10 may also include an electrode 26 which, when appropriately charged, provides a potential difference between the electrode 26 and the free-standing structure 16 and seed layer 20, resulting in an electrostatic force that pulls the free-standing structure 16 and seed layer 20 toward the electrode 26 and against the contact 12. With application of sufficient voltage to the electrode 26, the electrostatic force deforms the free-standing structure 16 and seed layer 20 and thereby displaces the free-standing structure 16 and seed layer 20 from the non-contacting (i.e., open or non-conducting) position shown in FIG. 2 to the contacting (i.e., closed or conducting) position shown in FIG. 3. Therefore, the electrode 26 may act as a "gate" with respect to the MEMS device 10, with voltages (referred to as "gate voltages") applied to the electrode 26 serving to control the opening or closing of the MEMS structure 14. The electrode 26 may be in communication with a gate voltage source 28, so that a gate voltage $V_G$ may be selectively applied to the electrode 26.

The contact 12, free-standing structure 16, and seed layer 20 are components of the circuit 30. The exemplary circuit 30 has a first side 32 and a second side 34 that, when disconnected from one another, are at different electric potentials relative to one another (as where only one of the sides is connected to a power source 36). The contact 12 and free-standing structure 16, by way of seed layer 20, can be respectively connected to either of the sides 32, 34 of the circuit 30, such that deformation of the free-standing structure 16 and seed layer 20 between the first and second positions acts to respectively pass and interrupt a current therethrough. The free-standing structure 16 and seed layer 20 may be repeatedly moved into and out of contact with the contact 12 at a frequency (either uniform or non-uniform) that is determined by the application for which the MEMS structure 14 is utilized. When the contact 12 and the bottom surface 17 of free-standing structure 16 that includes the seed layer 20 are separated from one another, the voltage difference between the contact 12 and free-standing structure 16 is referred to as the "stand-off voltage."

In one embodiment, the free-standing structure 16 and seed layer 20 may be in communication (e.g., via the anchor structure 22) with the power source 36, and the contact 12 may be in communication with an electrical load 38 having a load resistance $R_L$. The power source 36 may be operated as a voltage source or a current source. The free-standing structure 16 and seed layer 20 act as an electrical contact (i.e., ohmic contact), allowing a load current to flow from the power source 36 through the free-standing structure 16 and seed layer 20, into the contact 12 and to the electrical load 38 when the free-standing structure 16 and seed layer 20 are in the contacting position, and otherwise disrupting the electrical path and preventing the flow of current from the power source to the load when the free-standing structure 16 and seed layer 20 are in the non-contacting position.

The above-described MEMS structure 14 could be utilized as part of a circuit including other switch structures, whether similar or dissimilar in design, in order to increase the current and voltage capacity of the overall circuit. Such switch structures could be configured in series or in parallel to facilitate an even distribution of stand-off voltage when the switch structures are open and an even distribution of current when the switch structures are closed.

According to embodiments of the invention, the refractory metal and/or refractory metal alloy from which seed layer 20 is formed may include one or more of ruthenium, tantalum, niobium, rhodium, molybdenum, tungsten, vanadium, chromium, zirconium, hafnium and/or alloys of the above. As will be explained in greater detail below (in describing fabrication of the MEMS device 10), the free-standing structure 16 is formed on seed layer 20 via an electroplating process, with the seed layer 20 being subsequently being left intact on the bottom surface 17 of free-standing structure 16 upon completion of fabrication of the MEMS structure 14. When integrated, the free-standing structure 16 and the seed layer 20 form a free-standing and suspended metal MEMS structure 14 that is resistant to stresses imposed on the MEMS structure during fabrication and subsequent operation, with the specific properties of the MEMS structure being tailorable based on the specific materials from which the free-standing structure 16 and seed layer 20 are formed and based on the dimensions of the free-standing structure 16 and seed layer 20. In an exemplary embodiment, the thickness of free-standing structure 16 is substantially greater than the thickness of seed layer 20, such that the bending force related to the film stress does affect the planarity of the free-standing structure (i.e., beam)—with the thickness of the seed layer 20 being limited/selected such that the product of the residual stress in the free-standing MEMS structure ($\sigma$) and the thickness of the structure is >3× that of the product of the residual stress and thickness of the seed layer ($\sigma_{MEMS}*t_{MEMS} > 3\sigma_{SEED}*t_{SEED}$). As a result, the mechanical and electrical properties of MEMS structure 14 are defined by the material of metal free-standing structure 16, not the material of seed layer 20.

In an embodiment where MEMS device 10 is in the form of a MEMS switch, as is shown and described in FIGS. 1-3, the seed layer 20 is further configured to provide a mechanically robust and electrically stable ohmic contact between the free-standing structure 16 and the contact 12. That is, as the seed layer is formed of a refractory metal or refractory alloy exhibiting properties such as melting temperature above 1850° C. and a melting voltage above 0.4 V, the seed material is resistant to mechanical wear resulting from repeated physical impact with the substrate contact 12, and exhibits increased longevity when exposed to high temperatures (e.g., joule heating) and electrical discharges between the free-standing structure 16 and the contact 12. Accordingly, the seed layer 20 is able to increase longevity of the free-standing structure 16 and increase reliability of the MEMS switch.

In an exemplary embodiment, the MEMS structure 14 can further comprise a protective layer 40 formed on one or more remaining exposed surfaces of free-standing structure 16 (i.e., surfaces other than bottom surface 17). In one embodiment, and as shown in FIG. 1, protective layer 40 is applied to the exposed surfaces of free-standing structure 16 in order to surround the beam. The inclusion of seed layer 20 and protective layer 40 on free-standing structure 16 collectively serves to further increase the structural integrity of the free-standing structure 16 as well as provide chemical protection to the free-standing structure 16. That is, it is recognized that MEMS structure 14 may be exposed to etchants/chemicals used in micro- and nanofabrications, such as etchants employed in wet etching, with exposure of free-standing structure 16 to chemicals in the wet etching process potentially resulting in irreversible damage to free-standing structure 16 and, as a result, its structural integrity during operation. As such, the surrounding of free-standing structure 16 by seed layer 20 and protective layer 40 serves to protect the free-standing structure 16 from chemical attack during wet etching. The refractory metal and/or metal alloy (e.g., ruthenium, tantalum, niobium, rhodium, molybdenum, tungsten, titanium-tungsten alloy, etc.) from which seed layer 20 and protective layer 40 are formed is/are resistant to etchants/chemicals used in micro- and nanofabrications, including but not limited to sulfuric acid, hydrofluoric acid, buffered oxide, hydrogen peroxide and alkali photoresist developer solutions. As such, seed layer 20 and protective layer protect free-standing structure 16, and the resulting MEMS structure 14, from both deformation due to high temperatures and chemical attack due to wet etching.

Figure 4:
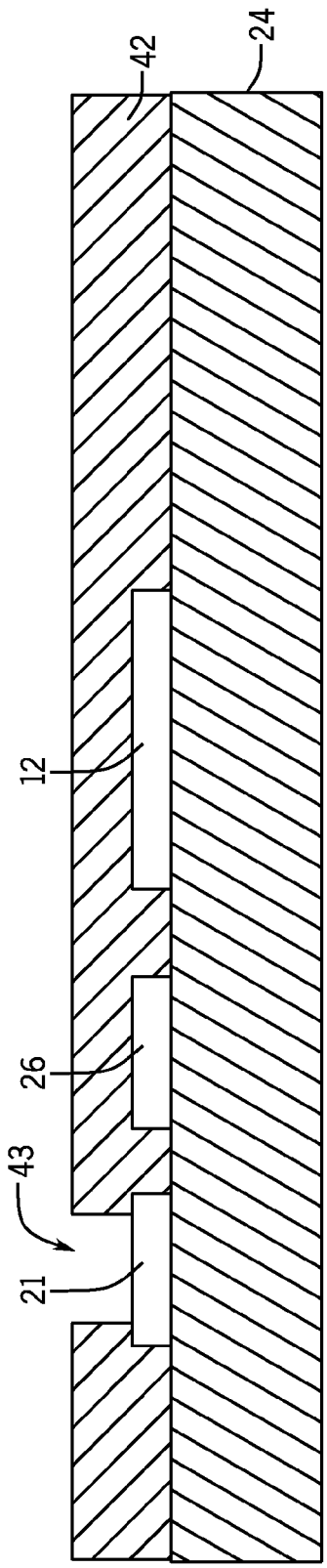

Referring now to FIGS. 4-9, process steps of a method for making MEMS device 10 are illustrated according to an embodiment of the invention. As shown in FIG. 4, a substrate 24 is initially provided on which the MEMS structure 14 is to be formed, with the substrate 24 being formed of any of a number of materials suitable for MEMS device fabrication, including silicon and silicon-based substrates (e.g., silicon carbide (SiC)), fused silica and glass for example. As also shown in FIG. 4, in fabricating the MEMS device 10 as a switching device, the conductive contact 12, electrode 26, and conductive mount 21 are formed on substrate 24. As known, the conductive contact 12, electrode 26, and conductive mount 21 may be formed by applying a layer of conductive metallic material (e.g., gold, copper, etc.) onto substrate 24 and performing a subsequent etching to pattern the layer and form the conductive contact 12, electrode 26, and conductive mount 21. Upon formation of the conductive contact 12, electrode 26, and conductive mount 21, a sacrificial release layer 42 is applied thereover in an area at which the free-standing structure 16 is to be formed. In the preferred embodiment of the invention, release layer 42 comprises $SiO_2$ (silicon dioxide); however, one skilled in the art would recognize that release layer 42 may comprise other materials, for example, but not limited to, a metal, ceramic, or polymer.

Figure 5:
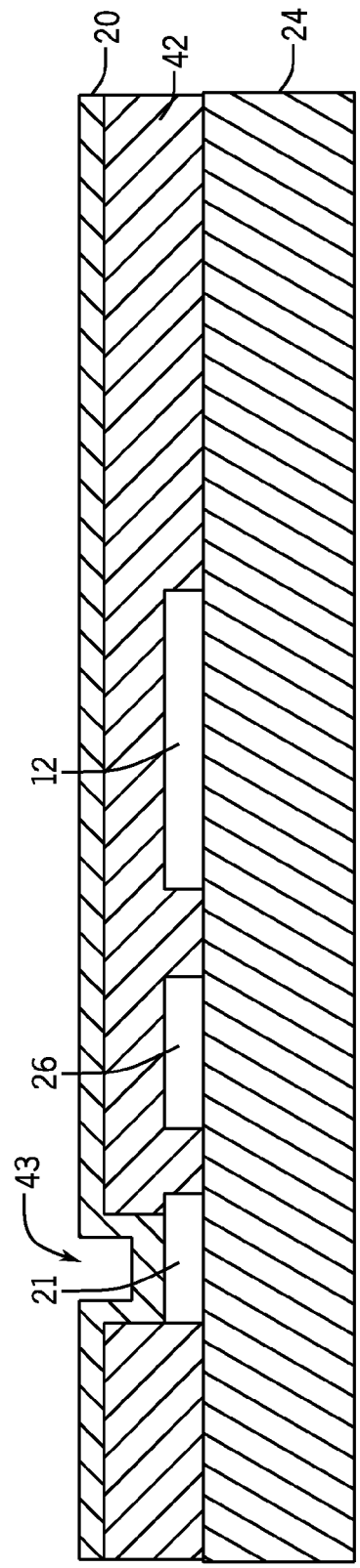

As shown in FIG. 5, in a next step of the fabrication of MEMS device 10, seed layer 20 is applied on release layer 42, such as via a sputtering process or other suitable application process. In one embodiment of the invention, seed layer 20 extends through an opening 43 in the release layer 42, in order to be in direct contact with conductive mount 21. Seed layer 20 comprises a refractory metal and/or refractory metal alloy material—which is defined herein as a metallic material exhibiting properties such as melting temperature above 1850° C. and a melting voltage above 0.4 V. The refractory metal/metal alloy applied may thus be one or more of ruthenium, tantalum, niobium, rhodium, molybdenum, tungsten, vanadium, chromium, zirconium, hafnium and/or alloys of the above, for example. As will be explained in further detail below, after completion of MEMS device 10, seed layer 20 will be left intact on the bottom surface 17 of free-standing structure 16 in order to provide a mechanically robust and electrically stable ohmic contact with the contact 12, as the refractory metal of the seed layer 20 is resistant to mechanical wear and exhibits increased longevity when exposed to high temperatures and electrical discharges. The seed layer 20 may also provide protection from damage due to chemical attacks during further wet etching occurring during fabrication thereof.

Figure 6:
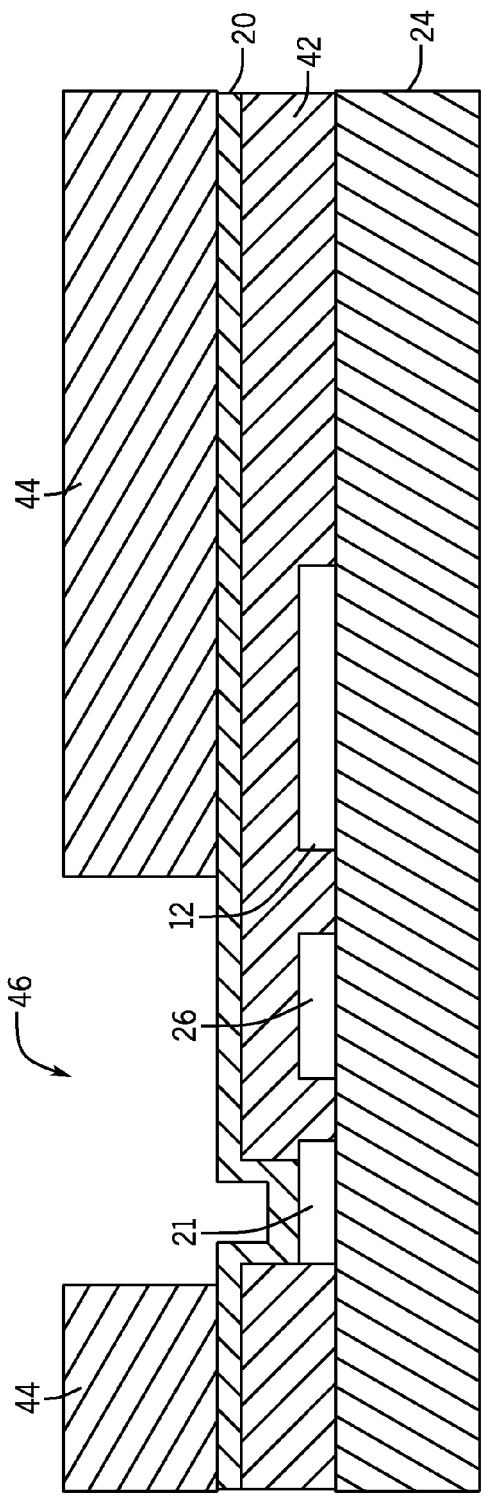
Figure 7:
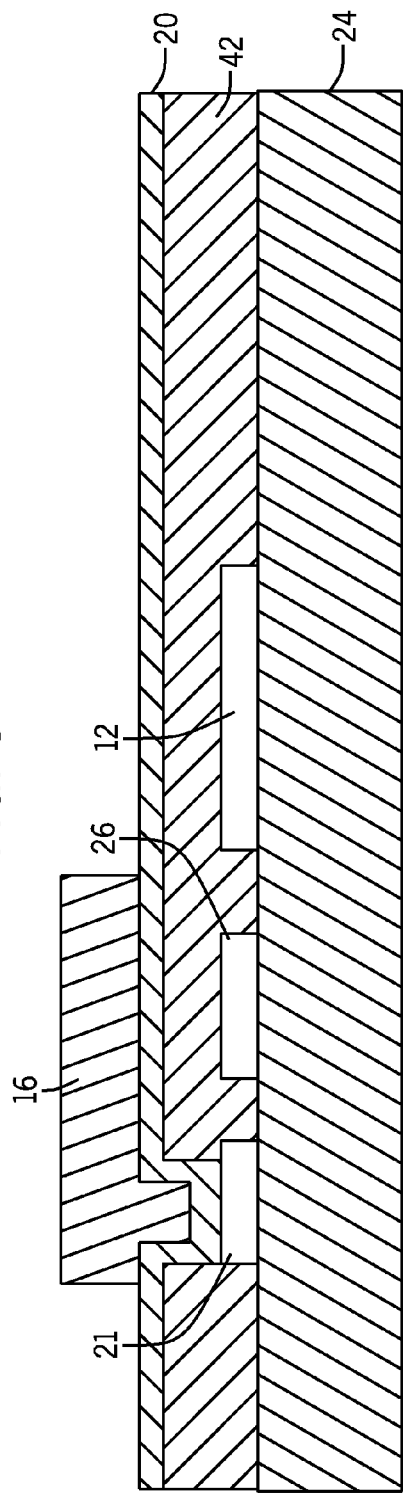

In a next step of the fabrication of MEMS device 10, a patterned photoresist mask 44 is applied to seed layer 20. As shown in FIG. 6, photoresist mask 44 includes at least one opening 46, wherein seed layer 20 remains exposed. Cantilever free-standing structure 16 is then formed by electroplating a metallic material onto seed layer 20 within the at least one opening 46 of photoresist mask 44. In the preferred embodiment of the invention, the metallic material used to form free-standing structure 16 comprises a NiW (nickel-tungsten) alloy; however, it is contemplated that the material of free-standing structure 16 may be any material judged appropriate by one skilled in the art.

In next steps of forming the MEMS device 10, the photoresist mask 44 is removed after free-standing structure 16 has been electroplated (FIG. 7) and the sacrificial release layer 42 and a portion of seed layer 20 not in contact with free-standing structure 16 (i.e., a first portion) is then removed (FIG. 8), resulting in a gap 48 between seed layer 20 and conductive layer 40. As a result, free-standing structure 16 includes at least one unexposed side 50 (underside 17 of free-standing structure), wherein seed layer 20 is in contact with free-standing structure 16, and further includes at least one exposed side 52, wherein free-standing structure 16 is not in contact with any other elements, and, therefore, is exposed. It is contemplated that release layer 42 and the portion of seed layer 20 not in contact with free-standing structure 16 is removed by etching processes known in the art in micro- and nanofabrication. For example, a wet etching process may use sulfuric acid, hydrofluoric acid, buffered oxide etch, and/or hydrogen peroxide. As another example, a dry etching process using known dry etching techniques, such as reactive ion etching, sputter etching, and vapor phase etching, may be used to remove release layer 42 and the portion of seed layer 20 not in contact with free-standing structure 16.

Referring now to FIG. 9, the addition of a protective layer 40 applied to at least one of the at least one exposed side 52 of free-standing structure 16 is illustrated, according to one embodiment of the invention. The inclusion of protective layer 40 (combined with seed layer 20) on free-standing structure 16 serves to provide chemical protection to the free-standing structure 16 with regard to etchants/chemicals used in micro- and nanofabrications, such as etchants employed in wet etching, with exposure of free-standing structure 16 to chemicals in the wet etching process potentially resulting in irreversible damage to free-standing structure 16 and, as a result, its structural integrity during operation. While the preferred embodiment of the invention includes protective layer 40, the addition of protective layer 40 is optional and not a requirement for all embodiment of the invention.

Beneficially, embodiments of the invention thus provide a MEMS device and associated free-standing and suspended metal MEMS structure that is resistant to stresses imposed on the MEMS structure during fabrication and subsequent operation, with the specific properties of the MEMS structure being tailorable based on the specific materials from which the free-standing structure and seed layer are formed and based on the dimensions/thicknesses of the free-standing structure and seed layer. The refractory seed layer is the layer onto which the free-standing MEMS structure will be deposited by electroplating and is constructed such that the mechanical and electrical properties of the free-standing and suspended electroplated metal MEMS structure are defined by the material of the free-standing structure. The seed layer provides an ohmic contact between the free-standing structure and a conductive contact on the substrate that is resistant to mechanical wear and exhibits increased longevity when exposed to high temperatures and electrical discharges, as the refractory metal of the seed layer has a melting temperature above 1850° C. and a melting voltage above 0.4 V.

According to one embodiment of the invention, a micro-electrical-mechanical system (MEMS) device includes a substrate and a free-standing and suspended electroplated metal MEMS structure formed on the substrate. The free-standing and suspended electroplated metal MEMS structure includes a metal mechanical element mechanically coupled to the substrate and a seed layer mechanically coupled to and in electrical communication with the mechanical element, the seed layer comprising at least one of a refractory metal and a refractory metal alloy, wherein a thickness of the mechanical element is substantially greater than a thickness of the seed layer such that the mechanical and electrical properties of the free-standing and suspended electroplated metal MEMS structure are defined by the material properties of the mechanical element According to another embodiment of the invention, a method of creating a micro-electrical-mechanical system (MEMS) device includes providing a substrate and forming a free-standing MEMS structure on the substrate. Forming the free-standing MEMS structure includes applying a sacrificial release layer on a portion of the substrate, applying a layer of seed metal over the substrate and the sacrificial release layer, wherein the seed metal comprises at least one of a refractory metal and a refractory metal alloy, applying a photoresist layer on a portion of the layer of seed metal, electroplating a metallic material onto the layer of seed metal not covered by the photoresist layer to form a free-standing structure, and removing the photoresist layer, the sacrificial release layer, and a portion of the layer of seed metal not in contact with the free-standing structure, such that the beam is cantilevered over the substrate, wherein a portion of the layer of seed metal in contact with the free-standing structure remains on an underside of the free-standing structure subsequent to the removing of the photoresist layer, the sacrificial release layer, and the portion of the layer of seed metal not in contact with the free-standing structure.

According to yet another embodiment of the invention, a free-standing and suspended metal micro-electro-mechanical system (MEMS) structure of a MEMS device is fabricated by applying a sacrificial release layer on a portion of a substrate, applying a seed layer of refractory metal over the substrate and the sacrificial release layer, applying a photoresist layer on a portion of the seed layer, electroplating a metallic material onto the seed layer in an area not covered by the photoresist layer to form a free-standing structure, the free-standing structure being mechanically coupled to and electrically connected with the seed layer, and removing the photoresist layer, the sacrificial release layer, and a portion of the seed layer such that a layer of refractory metal remains on an underside of the free-standing structure to collectively form a free-standing and suspended metal MEMS structure on the substrate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A micro-electrical-mechanical system (MEMS) device comprising:
   a substrate; and
   a free-standing and suspended electroplated metal MEMS structure formed on the substrate and comprising:
      a metal mechanical element mechanically coupled to the substrate;
      a seed layer mechanically coupled to and in electrical communication with the mechanical element, the seed layer comprising at least one of a refractory metal and a refractory metal alloy; and
      a protective layer mechanically coupled to the mechanical element, the protective layer being formed on at least one additional surface of the mechanical element not covered by the seed layer;
   wherein a thickness of the mechanical element is substantially greater than a thickness of the seed layer such that the mechanical and electrical properties of the free-standing and suspended electroplated metal MEMS structure are defined by the material properties of the mechanical element, with a product of a residual stress in the metal mechanical element and the thickness of the metal mechanical element being greater than three times (3×) that of a product of a residual stress in the seed layer and the thickness of the seed layer.

2. The MEMS device of claim 1 wherein the mechanical element is composed of a nickel-tungsten alloy.

3. The MEMS device of claim 1 wherein the seed layer is left intact on an underside of the mechanical element that faces the substrate.

4. The MEMS device of claim 3 wherein the MEMS device is a switch, the switch further comprising at least one conductive contact formed on the substrate and with the mechanical element comprising a beam cantilevered over the conductive contact;
   wherein the seed layer provides an ohmic contact between the beam and the at least one conductive contact when the beam is in a contacting position.

5. The MEMS device of claim 1 wherein the at least one of the refractory metal and refractory metal alloy of the seed layer has a melting voltage of greater than 0.4 V and a melting temperature of greater than 1850° C.

6. The MEMS device of claim 1 wherein the at least one of the refractory metal and refractory metal alloy comprises ruthenium, tantalum, niobium, rhodium, molybdenum, tungsten, vanadium, chromium, zirconium, hafnium, and/or alloys thereof.

7. The MEMS device of claim 1 wherein the at least one of the refractory metal and refractory metal alloy is resistant to etchants used in micro- and nanofabrications, the etchants comprising one or more of sulfuric acid, hydrofluoric acid, buffered oxide, hydrogen peroxide and alkali photoresist developer solutions.

8. The MEMS device of claim 1 wherein the MEMS device is an inertial sensor.

9. A method of creating a micro-electrical-mechanical system (MEMS) device comprising:
   providing a substrate; and
   forming a free-standing metal MEMS structure on the substrate, wherein forming the free-standing metal MEMS structure comprises:
      applying a sacrificial release layer on a portion of the substrate;
      applying a layer of seed metal over the substrate and the sacrificial release layer, wherein the seed metal comprises at least one of a refractory metal and a refractory metal alloy;
      applying a photoresist layer on a portion of the layer of seed metal;
      electroplating a metallic material onto the layer of seed metal not covered by the photoresist layer to form a free-standing structure;
      coating at least one additional side of the free-standing structure with a protective layer, the protective layer comprising a material that is resistant to damage or etching during a fabrication processes; and
      subsequent to coating at least one additional side of the free-standing structure with a protective layer, removing the photoresist layer, the sacrificial release layer, and a portion of the layer of seed metal not in contact with the free-standing structure, such that the free-standing structure is cantilevered over the substrate;
   wherein a portion of the layer of seed metal in contact with the free-standing structure remains on an underside of the free-standing structure subsequent to the removing of the photoresist layer, the sacrificial release layer, and the portion of the layer of seed metal not in contact with the free-standing structure.

10. The method of claim 9 wherein a thickness of the free-standing structure is substantially greater than a thickness of the layer of seed metal such that the mechanical and electrical properties of the free-standing metal MEMS structure are defined by the electroplated metallic material of the free-standing structure.

11. The method of claim 9 wherein the one of the refractory metal and the refractory metal alloy comprises one of ruthenium, tantalum, niobium, rhodium, molybdenum, tungsten, vanadium, chromium, zirconium, hafnium, and/or alloys thereof.

12. The method of claim 9 wherein coating the at least additional side of the free-standing structure with a protective layer comprises coating every exposed side of the free-standing structure with the protective layer.

13. The method of claim 9 wherein electroplating the metallic material onto the layer of seed metal comprises electroplating a nickel-tungsten alloy.

14. The method of claim 9 wherein removing the sacrificial release layer comprises performing a wet etching via application of at least one of sulfuric acid, hydrofluoric acid, buffered oxide, and hydrogen peroxide; and
    wherein the layer of seed metal is resistant to sulfuric acid, hydrofluoric acid, buffered oxide, and hydrogen peroxide and to alkali photoresist developer solutions.

15. The method of claim 9 further comprising forming a conductive layer on the substrate, the conductive layer comprising at least one MEMS contact, wherein the layer of seed material functions as an ohmic contact between the free-standing structure and the at least one MEMS contact when the free-standing structure is in a contacting position, with the layer of seed material having a melting voltage of greater than 0.4 V and a melting temperature of greater than 1850° C.

16. The method of claim 9 wherein applying the layer of seed metal and electroplating the metallic material further comprises selecting a thickness for each of the layer of seed metal and the metallic material to be applied such that a product of a residual stress in the free-standing structure and the thickness of the free-standing structure is greater than three times (3×) that of a product of a residual stress in the layer of seed metal and the thickness of the layer of seed metal.

17. A free-standing and suspended metal micro-electromechanical system (MEMS) structure of a MEMS device, wherein the metal MEMS structure is fabricated by:
    applying a sacrificial release layer on a portion of a substrate;
    applying a seed layer of refractory metal over the substrate and the sacrificial release layer;
    applying a photoresist layer on a portion of the seed layer;
    electroplating a metallic material onto the seed layer in an area not covered by the photoresist layer to form a free-standing structure, the free-standing structure being mechanically coupled to and electrically connected with the seed layer; and
    removing the photoresist layer, the sacrificial release layer, and a portion of the seed layer such that a layer of refractory metal remains on an underside of the free-standing structure to collectively form a free-standing and suspended metal MEMS structure on the substrate;
    wherein applying the seed layer and electroplating the metallic material further comprises selecting a thickness for each of the seed layer and metallic material to be applied such that a product of a residual stress in the free-standing structure and the thickness of the free-standing structure is greater than three times (3×) that of a product of a residual stress in the seed layer and the thickness of the seed layer.

18. The MEMS structure of claim 17 wherein a thickness of the electroplated metallic material of the free-standing structure is substantially greater than a thickness of the layer of refractory metal on the underside thereof, such that the mechanical and electrical properties of the free-standing and suspended electroplated metal MEMS structure are defined by the electroplated metallic material.

19. The MEMS structure of claim 17 wherein the metal MEMS structure is fabricated by forming a conductive contact on the substrate, such that the MEMS device comprises a MEMS switch; and
    wherein the layer of refractory metal on the underside of free-standing structure provides an ohmic contact between the free-standing structure and the conductive contact when the free-standing structure is in a contacting position.

20. The MEMS structure of claim 17 wherein the electroplated metallic material comprises a nickel-tungsten alloy and wherein the refractory metal comprises a material having a melting voltage of greater than 0.4 V and a melting temperature of greater than 1850° C.

21. The MEMS structure of claim 17 wherein the metal MEMS structure is fabricated by depositing a protective layer on one or more sides of the free-standing structure other than the underside of the free-standing structure.

* * * * *